(12) United States Patent
Ding

(10) Patent No.: US 9,570,476 B2
(45) Date of Patent: Feb. 14, 2017

(54) STRUCTURE OF CROSSING DATALINES AND SCANNING LINES AND FORMING METHOD IN A DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Hong Ding, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/826,119

(22) Filed: Aug. 13, 2015

(65) Prior Publication Data

US 2016/0293630 A1 Oct. 6, 2016

(30) Foreign Application Priority Data

Apr. 1, 2015 (CN) .......................... 2015 1 0152667

(51) Int. Cl.
*H01L 27/12* (2006.01)
*H01L 21/768* (2006.01)
*H01L 21/3213* (2006.01)

(52) U.S. Cl.
CPC ........ *H01L 27/124* (2013.01); *H01L 21/32139* (2013.01); *H01L 21/768* (2013.01); *H01L 27/1259* (2013.01)

(58) Field of Classification Search
CPC ...... H01L 21/563; H01L 21/565; H01L 25/50; H01L 21/561; H01L 21/56
See application file for complete search history.

(56) References Cited

FOREIGN PATENT DOCUMENTS

CN 104460163 A 3/2015

*Primary Examiner* — Selim Ahmed
(74) *Attorney, Agent, or Firm* — Alston & Bird LLP

(57) ABSTRACT

The array substrate comprises: data lines and scanning lines in an insulating crossing arrangement, where the data lines comprise first data lines and second data lines, the first data lines are arranged in a same layer with the scanning lines; the second data lines electrically connecting the first data lines via first via holes; first signal lines and common electrodes arranged on a substrate, where the first signal lines are arranged insulating from and in a same layer with the second data lines, the first signal line comprises a main portion and a bending portion which is arranged adjacently to the second data line; and a second insulating layer arranged between the first signal lines and the common electrodes, where second via holes are arranged in the second insulating layer, and the common electrodes are electrically connected to the first signal lines via the second via holes.

6 Claims, 6 Drawing Sheets

STRUCTURE OF CROSSING DATALINES AND SCANNING LINES AND FORMING METHOD IN A DISPLAY DEVICE

This application claims priority to Chinese Patent Application No. 201510152667.8, filed Apr. 1, 2015, titled "ARRAY SUBSTRATE, FORMING METHOD FOR THE SAME, AND DISPLAY DEVICE", filed with the Chinese State Intellectual Property Office on Apr. 1, 2015, which is incorporated by reference in its entirety herein.

BACKGROUND

Display devices are widely applied to various fields because of advantages such as small size, light weight, and low radiation. Some existing display devices have a touch control functions. Generally, common electrodes in the display device may be divided into a plurality of area blocks, and common electrodes within each of the area blocks are used as a touch control electrode. In the conventional technology, it is necessary to provide a respective lead for each touch control electrode, thus realizing outputting of a signal from each of the touch control electrodes.

Particularly, FIG. 1 shows an example of a conventional array substrate having a Mid-Com structure. A common electrode is reused as a touch control electrode. The array substrate includes a grid layer 2 formed on a substrate 1. An insulating layer 3 is arranged on the grid layer 2. A transistor structure 5 and data lines 4 are arranged on the insulating layer 3. An insulating layer 6 is arranged on the transistor structure 5 and the data lines 4. Common electrodes 7 are arranged on the insulating layer 6. An insulating layer 8 is arranged on the common electrodes 7. Pixel electrodes 9 and display touch control signal lines 11 electrically connected to the common electrodes 7 are arranged on the insulating layer 8. The display touch control signal lines 11 are used to provide display signals for the common electrodes 7 in a display stage of the display device, and the display touch control signal lines 11 are used to provide touch detection signals for the common electrodes 7 in a touch control stage. That is, this existing structure needs an additional step to form the display touch control signal lines 11 as touch control signal lines.

Likewise, an additional step is also required for other structures (such as a Top-Com structure) in the conventional technology to form the above touch control signal lines, which may cause a complex fabrication process and high costs for the fabrication.

DETAILED DESCRIPTION

To make the above object, features and advantages of the embodiments of the present disclosure better understood, in the following, embodiments of the present disclosure will be illustrated below in detail in conjunction with the drawings.

As described in the background, in the conventional technology, in order for functions of digital display and touch control, to display the touch control function digitally, it is necessary to fabricate additionally the touch control signal line connected to the common electrode, which increases the number of steps in the fabricating process, reduces production efficiency, and increases production costs.

To address the above problem, a forming method for an array substrate is provided in the embodiments of the present disclosure. Reference is made to FIGS. 2 to 12, which are schematic structural diagrams of steps of the forming method in the present embodiment.

Figure 1:
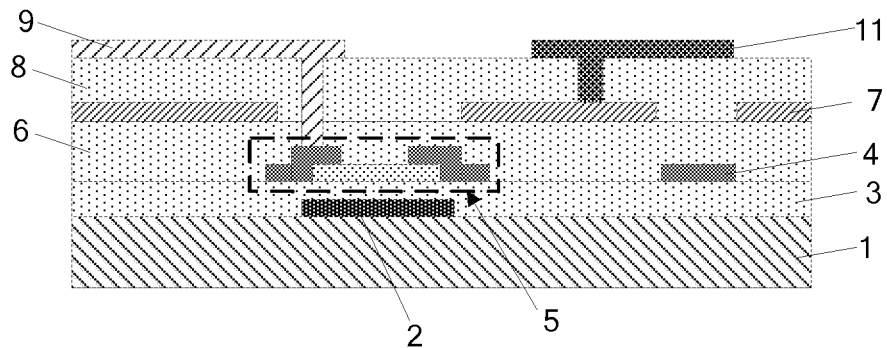
FIG. 1 is a schematic structural diagram of an array substrate in the conventional technology.
Figure 2:
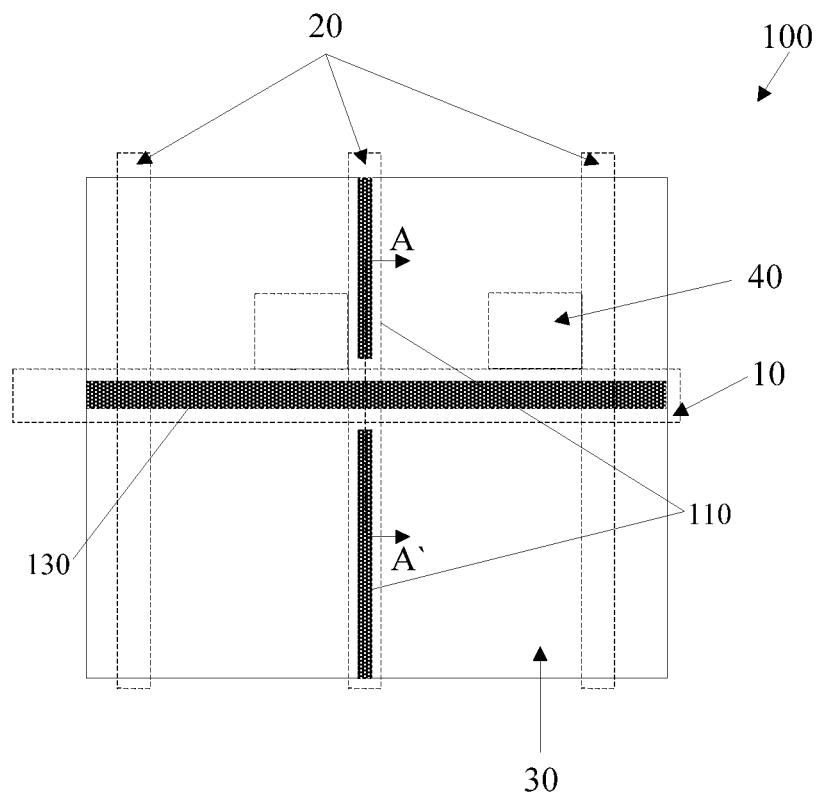
FIG. 2 is a top view of an array substrate in an embodiment of a forming method for an array substrate according to an embodiment of the present disclosure.
Figure 3:
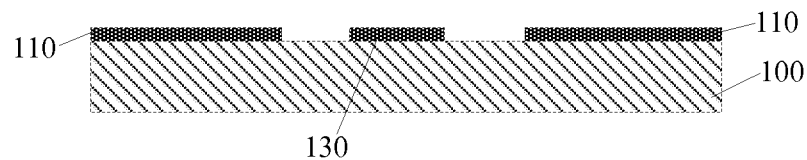
FIG. 3 is a cross sectional view taken along a direction A-A' of FIG. 2.

At first, reference is made to FIG. 2, which is a top view of an array substrate in the present embodiment. And in conjunction with FIG. 2, reference is made to FIG. 3, which is a cross sectional view taken along a direction A-A' of FIG. 2. It should be noted that, for the purpose of a clear expression, merely a few structures (a scanning line 130 and first data lines 110) formed on a substrate 100 are shown in FIG. 2, and other structures are not shown, however it is not intended to limit the present disclosure.

Firstly, a substrate 100 is provided. The substrate 100 is a basic carrier to form various subsequent components, and it is the customary technical means for those skilled in the art to provide the substrate 100, which is therefore not described in detail herein according to the embodiments of the present disclosure.

In the present embodiment, the substrate 100 includes an area 20 for forming scanning lines, an area 10 for forming data lines, and an area 40 for forming transistors, and the areas 20 and 10 cross mutually to form an area 30, which is used to form pixel electrodes and common electrodes in subsequent steps.

In the present embodiment, the substrate 100 may be a glass substrate. However, it is not limited in the embodiments of the present disclosure.

Then, scanning lines 130 and first data lines in an insulating crossing arrangement are formed on the substrate 100 (as described above, merely the scanning lines 130 and the first data lines 110 are shown in FIG. 2), and the first data lines 110 are arranged in the same layer with the scanning lines 130. Compared with the conventional technology where data lines and scanning lines 130 are formed respectively, the first data lines 110 and the scanning lines 130 arranged in the same layer according to the embodiments of the present disclosure enables the first data lines 110 and the scanning lines 130 to be obtained simultaneously in a same step, which can save steps and improve efficiency of the whole fabrication.

Particularly, the first data lines 110 and the scanning lines 130 may be formed by adopting the steps of:

forming a first conductive material layer on the substrate 100;

forming a first photoresist layer on the first conductive material layer;

providing a first mask having a pattern, and exposing the first photoresist layer through the first mask, to form the pattern in the first photoresist layer, and a part of the first conductive material layer being revealed through the pattern of the first photoresist layer; and etching, by taking the formed first photoresist layer with the pattern as an etching mask, to remove the revealed part of the first conductive material layer, where remaining of the first conductive material layer forms the first data lines and the scanning lines.

It can be seen that the first data lines 110 and the scanning lines 130 may be formed by adopting only one first mask, which saves masks compared to the manner in which the data lines and the scanning lines 130 are formed respectively in the conventional technology.

In the present embodiment, the first data lines 110 and the scanning lines 130 may be formed in metal, however it is not limited in the embodiment.

In order to realize insulation and cross between the scanning lines 130 and the first data lines 110, the first data lines 110 are cut to form gaps, and the scanning lines pass through the gaps in the first data lines 100, to realize mutual cross and insulation between the first data lines 110 and the scanning lines 130. In subsequent steps, the first data lines 110 are connected mutually by forming second data lines, and details will be explained in following steps.

Figure 4:
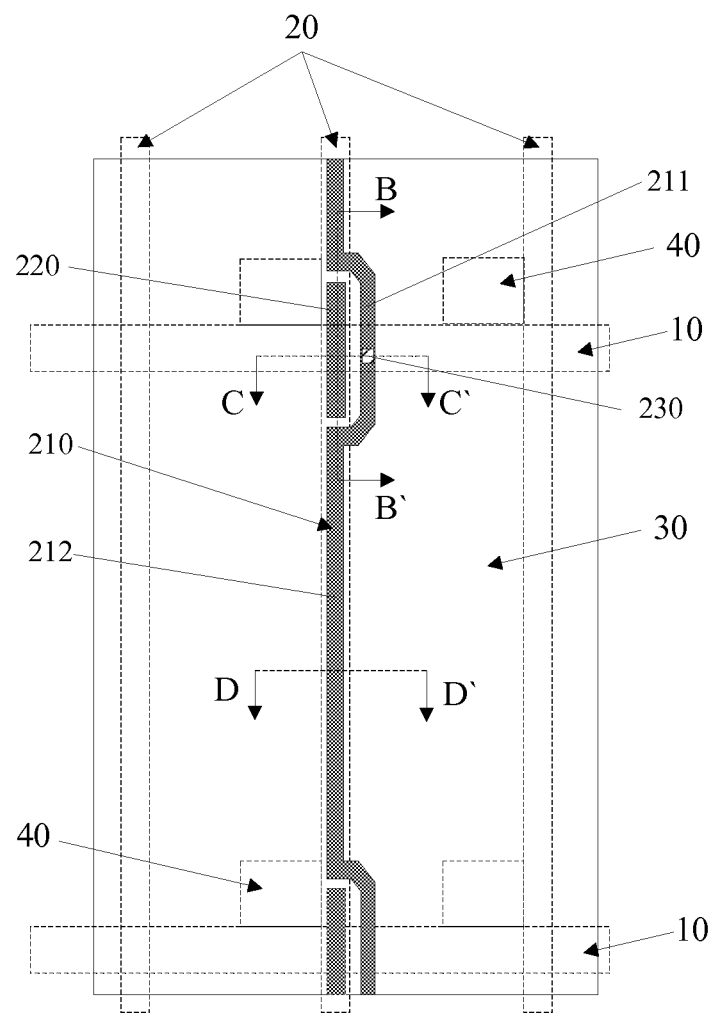
FIG. 4 is a top view of a substrate 100, after a second data line and a first signal line are formed.
Figure 5:
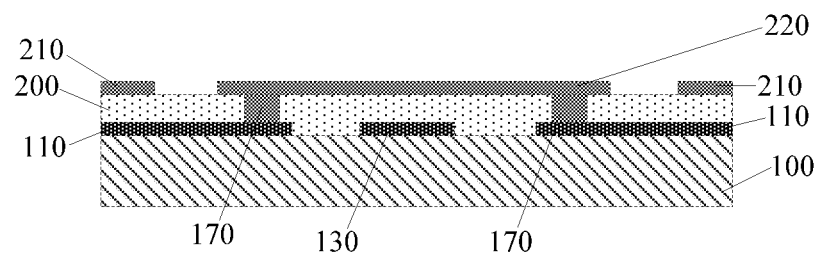
FIG. 5 is a cross sectional view taken along a direction B-B' of FIG. 4.
Figure 6:
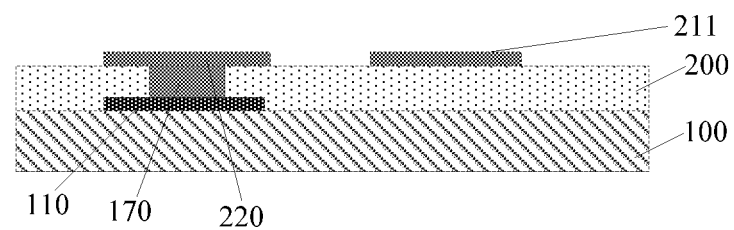
FIG. 6 is a cross sectional view taken along a direction C-C' of FIG. 4.
Figure 7:
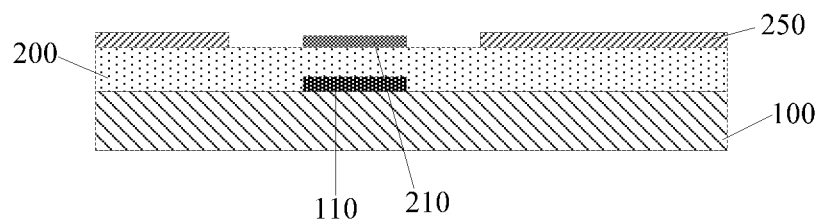
FIG. 7 is a cross sectional view taken along a direction D-D' of FIG. 4.

After forming the first data lines 110 and the scanning lines 130, a first insulating layer is formed on the substrate 100, the first data lines 110, and the scanning lines 130. Particularly, reference is made to FIGS. 4 to 7. FIG. 4 is a top view of the substrate 100, after a second data line 220 and a first signal line 210 are formed. FIG. 5 is a cross sectional view taken along a direction B-B' of FIG. 4. FIG. 6 is a cross sectional view taken along a direction C-C' of FIG. 4. And FIG. 7 is a cross sectional view taken along a direction D-D' of FIG. 4. Likewise, merely a few structures (the second data lines 220 and the first data lines 210) are shown in FIG. 4. However it is not intended to limit the present embodiment of the disclosure.

A formed first insulating layer 200 may be referred to FIGS. 5, 6 and 7. And after forming the first insulating layer 200, a plurality of first via holes 170 are formed in the first insulating layer 200. Locations of the first via holes 170 correspond to locations of the first data lines 110, and are used to electrically connect the first data lines 110 and the second data lines 220 formed subsequently.

The second data lines 220 are formed on the first insulating layer 200, and the second data lines 220 are electrically connected to the first data lines 110 via the first via holes 170. That is, the previously cut first data line 110 is connected to one end of the second data line 220 via a first via hole 170, and then the other end of the second data line 220 is electrically connected to an adjacent first data line 110 via another first via hole 170, thus realizing electrical connection between the first data lines 110 (referring to FIG. 5). Data lines are formed by the first data lines 110 and the second data lines 220 together.

An embodiment of the present disclosure further includes: forming first signal lines 210, which are arranged insulated from and in a same layer with the second data lines 220. After forming a common electrode subsequently, the first signal lines 210 are used as touch control signal lines for the common electrodes in a touch control stage. That is, the first signal lines 210 as the touch control signal lines may be formed while the second data lines 220 are formed. Compared with the conventional technology, where the touch control signal lines are formed by taking an additional step, the step and costs can be saved according to the present embodiment of the disclosure.

The first signal line 210 includes a main portion 212 and a bending portion 211 which is arranged adjacently to the second data line 220. That is, the bending portion 211 of the first signal line 210 is used to bypass the second data line 220, thus keeping insulated from the second data line 220. The details may be referred to FIGS. 4 and 6. The first signal line 210 bypasses the second data line 220 via the bending portion 211 at a location adjacent to the second data line 220.

In an embodiment, forming a pixel electrode 250 on the first insulating layer 200 (referring to FIG. 7) is included. In this way, a common electrode layer formed subsequently is located over the pixel electrodes 250, thus forming an array substrate 100 of an FFS (fringe field switching) structure.

Particularly, the second data lines 220, the first signal lines 210, and the pixel electrodes 250 may be formed in same steps:

forming a second conductive material layer on the first insulating layer 200;

forming a second photoresist layer on the second conductive material layer;

providing a second mask having a pattern, and exposing the second photoresist layer through the second mask, to form the pattern in the second photoresist layer, and a part of the second conductive material layer being revealed through the pattern of the second photoresist layer; and etching, by taking the formed second photoresist layer with the pattern as an etching mask, to remove the revealed part of the second conductive material layer, where remaining of the second conductive material layer forms the second data lines 220, the first signal lines 210, and the pixel electrodes 250.

Through the above steps, the second data lines 220, the first signal lines 210, and the pixel electrodes 250 may be formed with one second mask, which saves steps and costs compared with the conventional technology.

Figure 8:
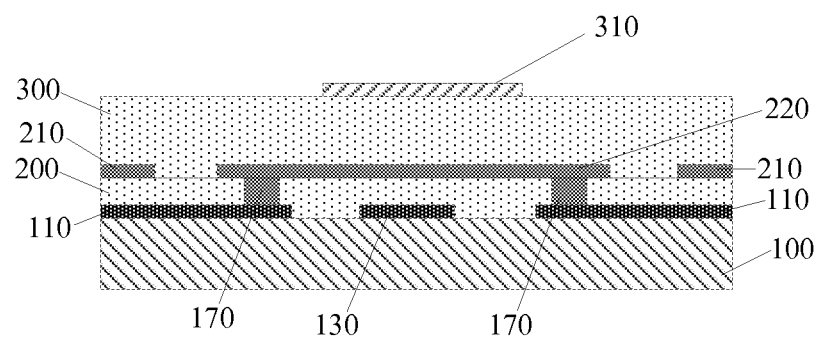
FIG. 8 is a cross sectional view taken along a direction B-B' of FIG. 4, after common electrodes are formed.
Figure 9:
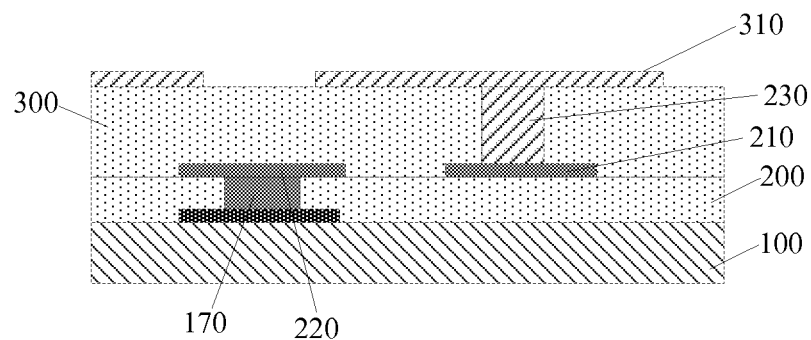
FIG. 9 is a cross sectional view taken along a direction C-C' of FIG. 4, after common electrodes are formed.

Then, reference is made to FIGS. 8 and 9. FIG. 8 corresponds to FIG. 5 and is a cross sectional view taken along a direction B-B' of FIG. 4, after common electrodes 310 are formed. FIG. 9 corresponds to FIG. 6 and is a cross sectional view taken along a direction C-C' of FIG. 4, after the common electrodes 310 are formed. A second insulating layer 300 is formed on the second data lines 220 and the first signal lines 210, and second via holes 230 are formed in the second insulating layer 300 (referring to FIG. 9). The second via holes are used to electrically connect the common electrodes formed subsequently on the second insulating layer 300 and the first signal lines 210 as the touch control signal lines.

Then, still referring to FIGS. 8 and 9, the common electrodes 310 are formed on the second insulating layer 300. As described above, since the pixel electrodes 250 have been formed on the second insulating layer 300, the formed common electrode 310 should allow a part of the pixel electrode 250 to be exposed in a direction perpendicular to the substrate 100, thus forming an electric-field structure of an FFS structure in practice.

As described above, the common electrodes 310 should have locations corresponding to locations of the second via holes 230, and thus the common electrodes 310 are electrically connected to the first signal lines 210 via the second via holes 230.

Figure 10:
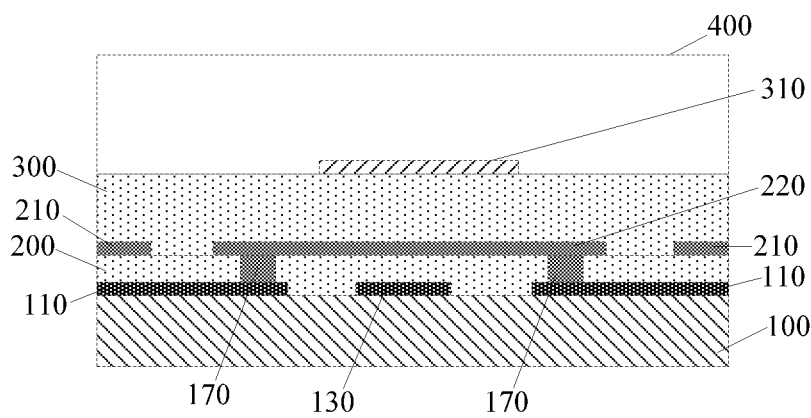
FIG. 10 is a cross sectional view taken along a direction B-B' of FIG. 4, after a liquid crystal layer is formed.
Figure 11:
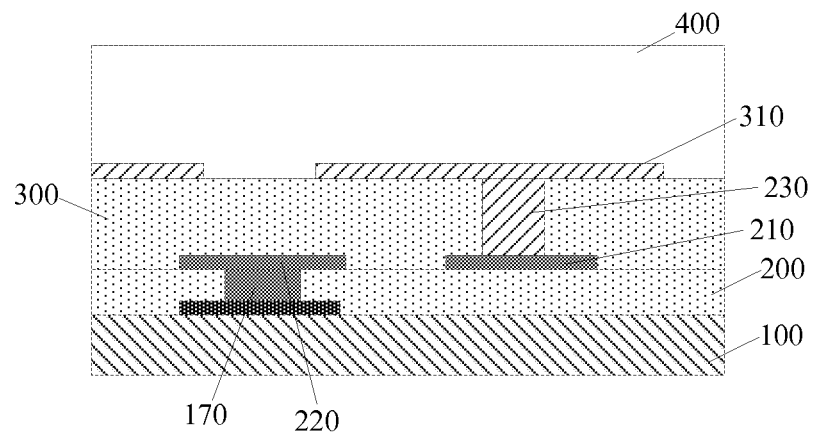
FIG. 11 is a cross sectional view taken along a direction C-C' of FIG. 4, after a liquid crystal layer is formed.

Reference is made to FIGS. 10 and 11. FIG. 10 corresponds to FIG. 8 and is a cross sectional view taken along a direction B-B' of FIG. 4, after a liquid crystal layer 400 is formed. FIG. 11 corresponds to FIG. 9 and is a cross sectional view taken along a direction C-C' of FIG. 4, after the liquid crystal layer 400 is formed. The liquid crystal layer 400 is formed on the common electrodes 310. That is, the array substrate 100 in the present embodiment is a touch control liquid crystal substrate. However, whether the liquid crystal layer 400 has to be formed is not limited in the embodiment of the present disclosure, and in an embodiment where an OLED (organic light emitting diode) is taken as a light source, it is not necessary to form the liquid crystal layer 400. Therefore it is not limited herein.

In addition, it should be noted that, the formed pixel electrodes 250 and the common electrodes 310 form an FFS structure, and the common electrodes 310 are located over the pixel electrodes 250, according to the present embodiment. However, it is not limited herein whether the above structure has to be formed, and in other embodiments of the embodiments of the present disclosure, the pixel electrodes 250 may be formed as follows.

After forming the common electrode 310, a third insulating layer is formed on the common electrodes 310; and
the pixel electrodes 250 are arranged on the third insulating layer and are opposite to the common electrodes 310 in a direction perpendicular to the substrate 100.

Figure 12:
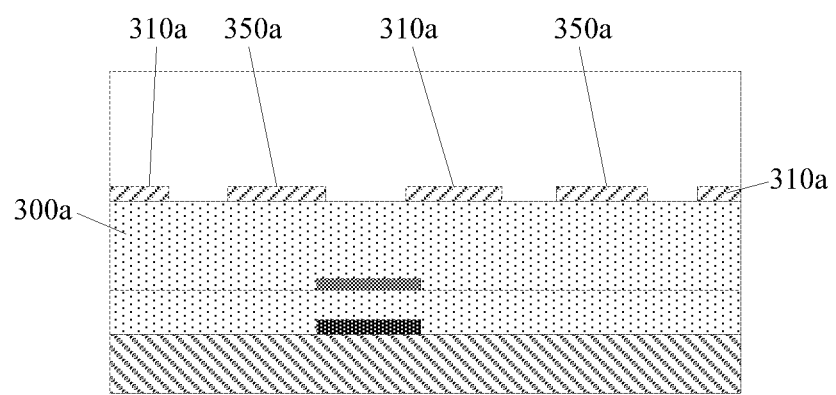
FIG. 12 is a schematic structural diagram of another embodiment of a forming method for an array substrate according to the present disclosure.

Or, the pixel electrodes and the common electrodes may be arranged in a same layer. Reference is made to FIG. 12, which is a schematic structural diagram of another embodiment of the present disclosure. This embodiment differs from the last embodiment in that, pixel electrodes 350a and common electrodes 310a are arranged in a same layer on a second insulating layer 300a, and the pixel electrodes 350a and the common electrodes 310a are arranged in a staggered manner. This does not affect implementation of the present embodiment of the disclosure. Therefore the location relationship between the pixel electrodes and the common electrodes should not limit the embodiment of the disclosure.

In addition, an array substrate is further provided in the embodiments of the present disclosure. Reference is made to FIGS. 4, 10 and 11. In the present embodiment, the array substrate includes:
a substrate 100;
data lines and scanning lines 130 in an insulating crossing arrangement on the substrate, where the data lines include first data lines 110 and second data lines 220, and the first data lines 110 are arranged in a same layer with the scanning lines 130;
a first insulating layer 200 arranged between the second data lines 220, the scanning line 130s, and the first data lines 110, where first via holes 170 are arranged in the first insulating layer 200, and the second data lines 220 electrically connect the first data lines 110 via the first via holes 170;
first signal lines 210 and common electrodes 310 arranged at the substrate 100, where the first signal lines 210 are arranged insulating from and in a same layer with the second data lines 220, the first signal line 210 includes a main portion 212 and a bending portion 211 which is arranged adjacently to the second data line 220;
a second insulating layer 300 arranged between the first signal lines 210 and the common electrodes 310, where second via holes 230 are arranged in the second insulating layer 300, and the common electrodes 310 are electrically connected to the first signal lines 210 via the second via holes 230; and
pixel electrodes 250.

According to the embodiments of the present disclosure, the data line and the scanning lines 130 are arranged in an insulating crossing arrangement in a same layer on the substrate 100. And the first data lines 110 of the data line are arranged in the same layer with the scanning lines 130. That is, the first data lines 110 and the scanning lines 130 can be formed simultaneously in one step during fabrication. Compared with the conventional technology where the data lines and the scanning lines 130 are formed respectively, steps and masks are saved. In addition, the second data lines 220 and the first signal lines 210 are also arranged in a same layer on the first insulating layer 200. And based on the same reason as above, the first signal lines 210 and the second data lines 220 can be formed in one step, thus saving the steps and costs. The first signal lines 210 are connected to the common electrode 310 via second via holes 230. That is, the first signal lines 210 can be used as touch control signal lines for the common electrodes 310 in a touch control stage. It is unnecessary to form the touch control signal line additionally as in the conventional technology. Instead the first signal lines 210 are formed while the second data lines 220 is formed, steps and costs are saved as compared with those in the conventional technology.

In the present embodiment, the pixel electrodes 250 are disposed in a same layer with the second data lines 220, and the common electrodes 310 are arranged oppositely to the pixel electrodes 250 in a direction perpendicular to the substrate 100. That is, an FFS structure, i.e., an arrangement where the pixel electrodes 250 and the common electrodes 310 are in different layers, is adopted in the present embodiment, and the common electrodes 310 are located above the pixel electrodes 250.

However, it is not limited according to the present embodiment of the disclosure whether the above structure has to be formed. In other embodiments of the embodiments of the present disclosure, a third insulating layer may be further arranged on the common electrodes 310, the pixel electrodes 250 are arranged on the third insulating layer, and the pixel electrodes 250 are arranged oppositely to the common electrodes 310 in a direction perpendicular to the substrate 100. That is, the pixel electrodes 250 and the common electrodes 310 are in different layers as in the last embodiment, however the pixel electrodes 250 are located above the common electrodes 310 in the present embodiment.

In addition, an IPS structure, which is an arrangement where the pixel electrodes are disposed in the same layer with the common electrodes, may also be adopted according to a third embodiment of the array substrate 100 of the present disclosure. Reference is made to FIG. 12, which is a schematic structural diagram of the third embodiment. This embodiment differs from the forgoing embodiments in that, the pixel electrodes 350a and the common electrodes 310a are arranged in a same layer on the second insulating layer 300a, and the pixel electrodes 350a and the common electrodes 310a are arranged in a staggered manner. This does not affect implementation of the embodiment of the disclosure. Therefore a location relationship between the pixel electrodes 350a and the common electrodes 310a should not be limited in the present embodiment of the disclosure.

In addition, a display device is further provided in an embodiment of the present disclosure. The display device includes the above array substrate. Since the display device adopts the above array substrate, a driving method for the display device includes a plurality of display time sequence stages and touch control time sequence stages, which are distributed alternately. In a display time sequence stage, a display signal is provided for a corresponding common electrode through a first signal line; and in a touch control time sequence stage, a touch control signal is provided for the corresponding common electrode through a first signal line. Therefore, according to the embodiments of the present disclosure, the common electrode may be reused as a touch control electrode, and the steps are less than those in the conventional technology, thus increasing efficiency and also saving costs in fabrication.

The disclosure is not limited to the embodiments described above. Those skilled in the art may make various alternations and modifications without departing from the essence and the scope of the present disclosure. Therefore the scope of the present disclosure should conform to the scope as defined in the claims.

The invention claimed is:

1. An array substrate, comprising:
a substrate;
a plurality of scanning lines and a plurality of data lines are arranged on the substrate, wherein the scanning lines cross and are insulated from the data lines, and wherein the data lines comprise first data lines and second data lines, and the first data lines are arranged in a same layer with the scanning lines;
a first insulating layer arranged between the second data lines and the scanning lines, and between the second data lines and the first data lines, wherein first via holes are arranged in the first insulating layer, and the second data line electrically connects two adjacent first data lines via the first via holes; and
a plurality of first signal lines and a plurality of common electrodes in mutual electrical connection on the substrate, wherein the first signal lines are arranged insulated from and in a same layer with the second data lines.

2. The array substrate according to claim 1, wherein the first signal line comprises a main portion and a bending portion which is arranged adjacently to the second data line;
a second insulating layer is arranged between the first signal lines and the common electrodes, second via holes are arranged in the second insulating layer, and the common electrodes are electrically connected to the first signal lines via the second via holes; and
the substrate further comprises pixel electrodes.

3. The array substrate according to claim 2, wherein the common electrodes and the pixel electrodes are arranged in different layers.

4. The array substrate according to claim 3, wherein the pixel electrodes are disposed in the same layer with the second data lines, and the common electrodes are arranged oppositely to the pixel electrodes in a direction perpendicular to the substrate.

5. The array substrate according to claim 3, wherein a third insulating layer is further arranged on the common electrodes, the pixel electrodes are arranged on the third insulating layer, and the pixel electrodes are arranged oppositely to the common electrodes in a direction perpendicular to the substrate.

6. A display device, comprising an array substrate, the array substrate comprising:
a substrate;
wherein a plurality of scanning lines and a plurality of data lines are arranged on the substrate, and the scanning lines cross and are insulated from the data lines,
wherein the data lines comprise first data lines and second data lines, and the first data lines are arranged in a same layer with the scanning lines,
a first insulating layer arranged between the second data lines and the scanning lines, and between the second data lines and the first data lines, wherein first via holes are arranged in the first insulating layer, and the second data line electrically connects two adjacent first data lines via the first via holes; and
a plurality of first signal lines and a plurality of common electrodes in mutual electrical connection on the substrate, wherein the first signal lines are arranged insulated from and in a same layer with the second data lines.

* * * * *